United States Patent
Ema et al.

(10) Patent No.: US 6,757,341 B1
(45) Date of Patent: Jun. 29, 2004

(54) DIGITAL AUDIO INTERFACE SIGNAL DEMODULATING DEVICE

(75) Inventors: Noriyuki Ema, Toyonaka (JP); Yasushi Nakajima, Neyagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/914,539

(22) PCT Filed: Mar. 1, 2000

(86) PCT No.: PCT/JP00/01181

§ 371 (c)(1),
(2), (4) Date: Aug. 30, 2001

(87) PCT Pub. No.: WO00/52692

PCT Pub. Date: Sep. 8, 2000

(30) Foreign Application Priority Data

Mar. 2, 1999 (JP) .............................. 11-54088

(51) Int. Cl.[7] .............................................. H04L 27/22
(52) U.S. Cl. ...................... 375/333; 375/360; 375/361
(58) Field of Search ................................ 375/333, 359, 375/360, 361; 331/17

(56) References Cited

U.S. PATENT DOCUMENTS 5,003,557 A * 3/1991 Fujiyama .................... 375/357
5,465,268 A * 11/1995 Rainbolt ..................... 375/333
5,570,393 A * 10/1996 Kho ............................ 375/333
5,889,820 A * 3/1999 Adams ........................ 375/282
5,933,058 A * 8/1999 Pinto et al. .................. 331/17

FOREIGN PATENT DOCUMENTS

| JP | 63-148743 | 6/1988 |
| JP | 1-151082 | 6/1989 |
| JP | 4-162264 | 6/1992 |
| JP | 8-214033 | 8/1996 |

* cited by examiner

Primary Examiner—Don N. Vo
(74) Attorney, Agent, or Firm—Wenderoth, Lind & Ponack, L.L.P.

(57) ABSTRACT

In a digital audio interface signal demodulating apparatus (DDAp) that adds a preamble (PA) and additional information (V, U, C, P) to a digital audio signal (Sda) and demodulates into a digital audio interface signal (Sdai) after subjected to bi-phase modulation for transmission, based on both of positive and negative edges of a reference clock (Src) having a frequency higher than twice a minimum inverse frequency (1/T) of said digital audio interface signal (Sdai) and not necessarily synchronizing with said digital audio interface signal (Sdai), a modulation period (nT) of the digital audio interface signal (Sdai) is decided, and a decision signal (Sj) is generated. Furthermore, based on the decision signal (Sj), the: preamble (PA) is detected, and based on the detected preamble (PA), an audio signal (Sda) is obtained from said decision signal (Sj) through demodulation.

8 Claims, 12 Drawing Sheets

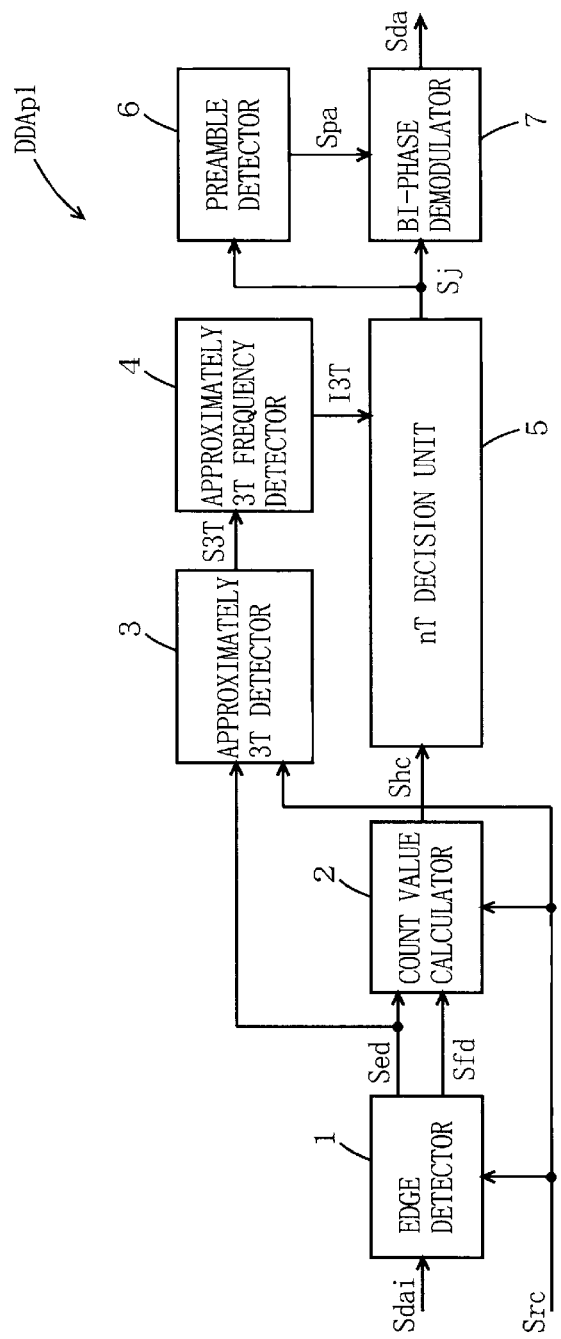
F I G. 1

F I G. 2
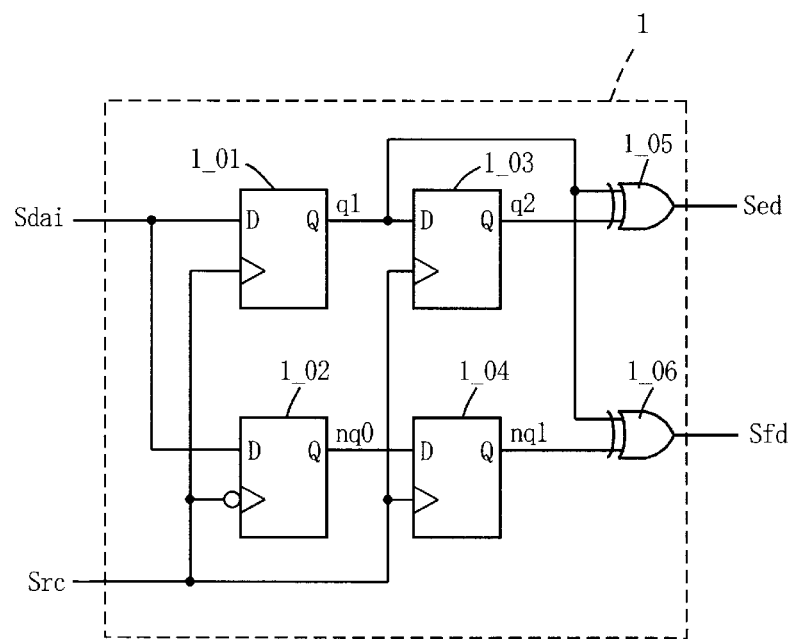

F I G. 5

(a) TABLE FOR SAMPLING FREQUENCY "32kHz" T3k

| APPROXIMATELY 3T PERIOD | ~238 | 239~248 | 249~266 | 267~276 | 277~289 | 290~301 | 302~ |
|---|---|---|---|---|---|---|---|
| 1T | 5~11 | 5~11 | 5~12 | 5~13 | 5~13 | 5~14 | 5~14 |
| 2T | 12~18 | 12~19 | 13~20 | 14~21 | 14~22 | 15~23 | 15~24 |
| 3T | 19~34 | 20~34 | 21~34 | 22~34 | 23~34 | 24~34 | 25~34 |

(b) TABLE FOR SAMPLING FREQUENCY "44.1kHz/48kHz" T4k

| APPROXIMATELY 3T PERIOD | ~161 | 162~174 | 175~184 | 185~200 | 201~212 | 213~ |
|---|---|---|---|---|---|---|
| 1T | 3~7 | 3~8 | 3~8 | 3~9 | 3~10 | 3~10 |
| 2T | 8~12 | 9~13 | 9~14 | 10~15 | 11~16 | 11~17 |
| 3T | 13~34 | 14~34 | 15~34 | 16~34 | 17~34 | 18~34 |

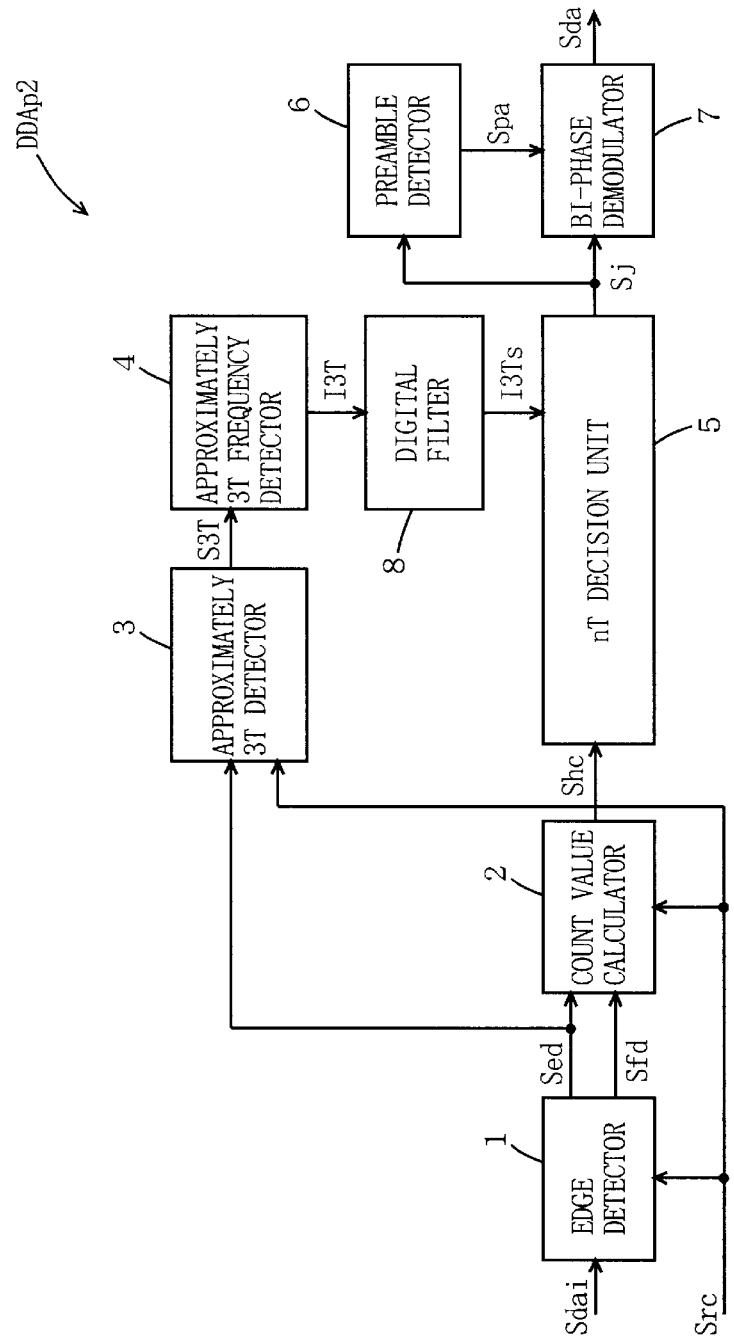
F I G. 6

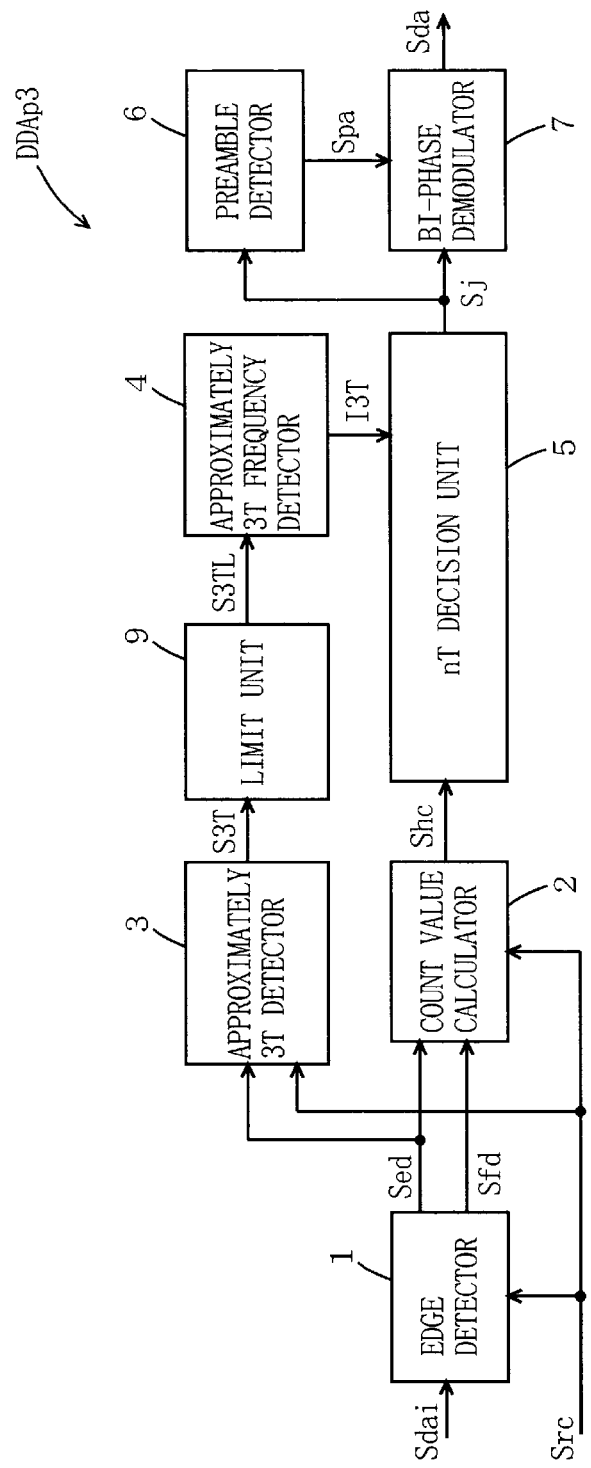
F I G. 7

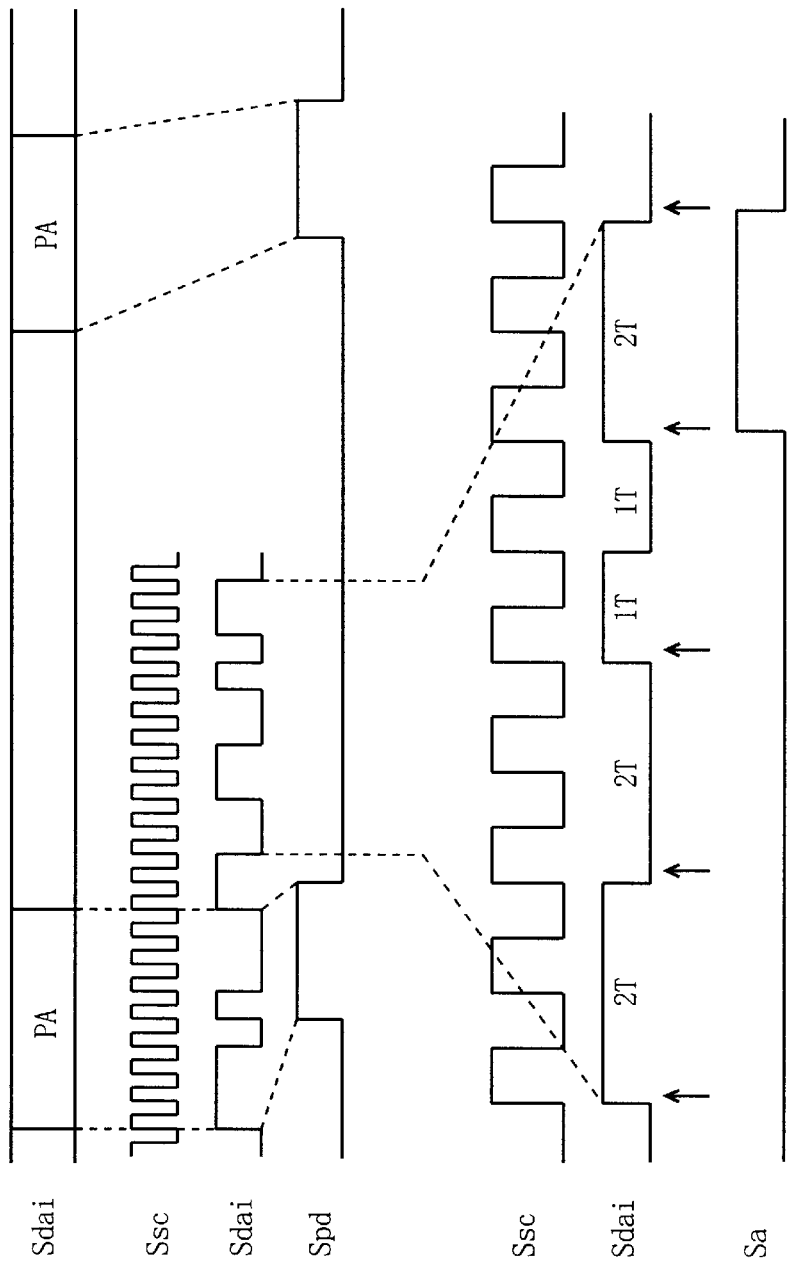

DIGITAL AUDIO INTERFACE SIGNAL DEMODULATING DEVICE

TECHNICAL FIELD

The present invention relates to a digital audio interface signal demodulating apparatus that receives a digital audio interface signal for use in data transmission between digital audio equipments, and demodulates into a digital audio signal.

BACKGROUND ART

Standards for digital audio signal transmission between digital audio equipments such as a compact disc i(CD), digital audio tape recorder (DAT), and a mini disc (MD) include IEC (International Commission)-958 "Digital Audio Interface", and EIAJ (Electronic Industries Association of Japan)-CP-1201 "Digital Audio Interface".

FIG. 10 shows outlines of a digital audio interface based on these standards. For CDs, DATs, and MDs, an audio sample is composed of two channels: a left channel and a right channel. Two data units each called a sub-frame respectively represent a channel 1 and a channel 2, and form, as a set, one sample. The period of this one sample exactly corresponds to a period that is a submultiple of a sampling frequency FS. Also, 192 samples forms one block.

One sub-frame is composed of periods of 64T, where T is a time that is one-128th of a sampling period, and represents data for 32 bits. This T is a minimum inverse period of the digital audio interface signal. The contents of one sub-frames include a preamble for 8T (4 bits), reserve data for 8T (4 bits), audio sample data for 40T (20 bits), and additional data for 8T (4 bits). The additional data is composed of a validity flag V, a user's bit U, a channel status C, and a parity P.

The reserve data, the audio sample data, and the additional data except for the preamble, have been bi-phase-mark modulated. Each of these is represented by 2T if 0 or successive 1T if 1, and has two patterns based on the immediately preceding logic.

The preamble is for indicating synchronization of sub-frames at transmission, and is so formed as to include 3T, which is not used in bi-phase-mark modulation, at the head in order to have unique periodic patterns. With three periodic patterns B, M, and W, the block head of each of 192 frames and the channels 1 and 2 can be identified. Hereinafter, the preamble is referred to as PA, a preamble having the periodic pattern B is as a preamble PAb, a preamble having the periodic pattern M is as a preamble PAm, and a preamble having the periodic pattern W is as a preamble PAw.

FIG. 11 shows a conventional demodulating apparatus that demodulates the above digital audio interface signal. A conventional digital audio interface signal demodulating apparatus DDAC includes a preamble detection circuit 101, an analog PLL circuit 102, and a bi-phase demodulation circuit 103.

The preamble detection circuit 101 detects a 3T detection signal in a digital audio interface signal Sdai, and outputs a preamble detection signal Spd.

In the PLL circuit 102, the phase is locked to the preamble detection signal Spd, and a synchronous clock Ssc having a 32-times frequency is outputted therefrom.

The bi-phase demodulation circuit 103 carries out bi-phase demodulation on the digital audio interface signal Sdai by using the synchronous clock Ssc, and outputs a digital audio signal Sda.

FIG. 12 shows the operation timing of the digital audio interface signal demodulating apparatus DDAc. As shown in FIG. 12, the preamble detection circuit 101 detects an inverse interval equal to or more than 2.5T, based on the reference clock Ssc having a period shorter than a minimum inverse interval of the digital audio interface signal Sdai, and outputs the preamble signal Spd.

The PLL circuit 102 forms an analog phase locked loop (PLL) by using a VCO, for comparing, in phase, 32 frequency divisions of the VCO and the preamble detection signal Spd, and outputting the synchronous clock Ssc having the 32-times frequency.

The bi-phase demodulation circuit 103 extracts a signal from the digital audio interface signal Sdai based on the synchronous clock Ssc, and outputs 1 if the signal differs from the immediately preceding one, and 0 if it matches the same, thereby outputting a digital audio signal Sda.

As stated above, the conventional digital audio interface signal demodulating apparatus detects the preamble of a digital audio interface signal, generates a clock that synchronizes with the digital audio interface signal by using an analog PLL, and demodulates the digital audio interface signal Sdai, which is a bi-phase-mark signal. However, the digital audio interface signal demodulating apparatus has such problems caused by the analog PLL circuit as described below. For realizing LSI, compared with a digital circuit, the analog PLL occupies a larger area on an LSI, thereby causing an increase in LSI cost.

To construct the analog PLL circuit, analog circuits such as a VCO and low-pass filter are required, and therefore the number of components is increased. As a result, the degree of integration in the PLL circuit and the digital audio interface signal demodulating apparatus cannot be increased, thereby increasing production cost.

The analog PLL circuit consumes large power, leading to large power consumption of the digital audio interface signal demodulating apparatus, which is problematic in view of energy conservation. Especially, depending on power consumption, the life of a battery in a portable device greatly varies.

In the analog PLL circuit, changes in capabilities or characteristics with time over operation time are too large to be negligible. Consequently, some measures have to be taken against changes with time after the apparatus is released incorporated in audio equipment.

Furthermore, the conventional digital audio signal demodulating apparatus requires two asynchronous clocks, a reference clock and a PLL clock.

These problems above are obstructive, especially for realizing LSI of the digital audio signal demodulating apparatus, to its stability and reliability, downsizing, ease of test, and others. Also, with only being made suitable for LSI, the circuit cannot be applied to a wide range of frequency of the inputted digital audio interface signal.

The present invention is to solve the above conventional problems, and an object thereof is to provide a digital audio signal demodulating apparatus capable of demodulating, through full digitalization, a digital audio interface signal without using any analog PLL circuit in accordance with a reference clock having a relatively low frequency and not necessarily synchronizing with the inputted digital audio interface signal, and also applicable to a wide range of frequency.

DISCLOSURE OF THE INVENTION

To achieve the above object, the present invention has the following aspects.

A first aspect of the present invention is directed to a digital audio interface signal demodulating apparatus for adding a preamble and additional information to a digital audio signal and demodulating a digital audio interface signal bi-phase-modulated for transmission, and the apparatus includes:

an edge detector for generating, whenever detecting an edge of the digital audio interface signal, a pulse-like edge detection signal and a latter-half detection signal indicating that the edge of the digital audio interface signal is present, based on a positive edge of a reference clock having a frequency higher than twice a minimum inverse frequency of the digital audio interface signal and not necessarily synchronizing with the digital audio interface signal;

a count value calculator for obtaining, whenever supplied with the edge detection signal, a count value by counting the edge detection signal in accordance with the reference clock, and calculating a half clock count value by adding, to a value obtained by multiplying the count value by 2, 1 if the latter-half detection signal is supplied, and subtracting 1 from the count value if an immediately preceding latter-half detection signal is supplied;

an approximately 3T detector for obtaining, whenever supplied with the edge detection signal, a count value by counting the edge detection signal in accordance with the reference clock, and generating a first approximately 3T detection signal by detecting a value of the count value within a predetermined range;

an approximately 3T period detector for counting the period of the first approximately 3T detection signal in accordance with the reference clock, and generates first approximately 3T period information;

a decision unit for deciding a modulation period of modulating the digital audio interface signal by comparing the half clock count value with a predetermined table corresponding to the first approximately 3T detection signal, and generating a decision signal;

a preamble detector for detecting the preamble based on the decision signal, and generates a preamble detection signal; and a bi-phase demodulator for carrying out demodulation, for output, into the digital audio signal from the decision signal with timing of the preamble detection signal.

As stated above, in the first aspect, the edge detection signal is counted, whenever inputted, in accordance with the reference clock and, in the count value, values within a predetermined range are detected for detection of approximately 3T. The period of this approximately 3T is measured, and through table decision determined by the period of the approximately 3T, a demodulation output can be obtained. Thus, only with the reference clock having a low frequency, the apparatus can be applied to a wide range of frequency without using any PLL.

According to a second aspect of the present invention, in the first aspect, the edge detector generates a first extracted signal extracted from the digital audio interface signal based on the reference clock, generates a first inverse extracted signal extracted from the digital audio interface signal based on an inverse clock of the reference clock and further based on the reference clock, and outputs the edge detection signal by detecting an edge of the first extracted signal, and generates; the latter-half detection signal by XORing the first extracted signal and the first inverse extracted signal.

According to a third aspect of the present invention, in the first aspect, the apparatus further includes a digital filter for filtering the first approximately 3T period information, and generating second approximately 3T period information, wherein the decision unit generates the decision signal by comparing the half clock count value with a predetermined table corresponding to the second approximately 3T period information.

As stated above, in the third aspect, even if the first approximately 3T period information is fluctuated caused by erroneous detection due to noise and other factors, stable approximately 3T period information can be obtained. Also, slow fluctuations of the approximately 3T period information can be followed, and therefore the period can be correctly decided in the decision unit.

According to a fourth aspect of the present invention, in the first aspect, the apparatus further includes a limiter for suppressing the first approximately 3T detection signal for a predetermined time period, and then outputting as a second approximately 3T detection signal, wherein the approximately 3T period detector counts the period of the second approximately 3T detection signal in accordance with the reference clock.

As stated above, in the fourth aspect, the limiter provided between the approximately 3T detector and the approximately 3T period detector detects the first approximately 3T even if the 3Ts in the preamble are close to each other, and adds a limit signal so that the approximately 3T detection signal is not outputted during a predetermined period from the trailing edge of the approximately 3T detection signal for limiting the approximately 3T period information. Thus, more correct approximately 3T period information can be outputted.

According to a fifth aspect of the present invention, in the first aspect, the apparatus further includes a limiter for suppressing the first approximately 3T detection signal for a predetermined time period, and then outputting as a second approximately 3T detection signal; and a digital filter for filtering the first approximately 3T period information and generating second approximately 3T period information, wherein the approximately 3T period detector counts a period of the second approximately 3T detection signal in accordance with the reference clock, and the decision unit generates the decision signal indicating the period of modulating the digital audio interface signal by comparing the half clock count value with a predetermined table corresponding to the second approximately 3T period information.

As stated above, in the fifth aspect, the effects in the above third and fourth aspects can be simultaneously obtained.

A sixth aspect of the present invention is directed a digital audio interface signal demodulating apparatus for adding a preamble and additional information to a digital audio signal and demodulating a digital audio interface signal bi-phase-modulated for transmission, and the apparatus includes:

an edge detector for generating, whenever detecting an edge of the digital audio interface signal, a pulse-like edge detection signal and a latter-half detection signal indicating that the edge of the digital audio interface signal is present, based on a positive edge of a reference clock having a frequency higher than twice a minimum inverse frequency of the digital audio interface signal and not necessarily synchronizing with the digital audio interface signal;

a count value calculator for obtaining, whenever supplied with the edge detection signal, a count value by counting the edge detection signal in accordance with the reference clock, and calculating a half clock count value by adding, to a value obtained by multiplying the count value by 2, 1 if the latter-half detection signal is supplied, and subtracting 1 from the count value if an immediately preceding latter-half detection signal is supplied;

an approximately 3T detector for generating a third approximately 3T detection signal by detecting a value of the half clock count value within a predetermined range;

an approximately 3T period detector for counting a period of the third approximately 3T detection signal in accordance with the reference clock, and generates first approximately 3T period information;

a decision unit for deciding a modulation period of modulating the digital audio interface signal by comparing the half clock count value with a predetermined table corresponding to the first approximately 3T detection signal, and generating a decision signal;

a preamble detector for detecting the preamble based on the decision signal, and generates a preamble detection signal; and a bi-phase demodulator for carrying out demodulation, for output, into the digital audio signal from the decision signal with timing of the preamble detection signal.

As stated above, in the sixth aspect, edge detection is carried out on the digital audio interface signal on both of the positive and negative edges of the reference clock, and from a detection output, the count value is obtained at a half clock of the reference clock. Thus, more correct approximately 3T detection can be performed, and therefore more correct approximately 3T information can be outputted.

According to a seventh aspect of the present invention, in the first aspect, the apparatus further includes a switching unit for switching among a plurality of predetermined tables corresponding to the first approximately 3T period information.

As stated above, in the seventh aspect, the count value output from the approximately 3T period detector has an effect to automatically change decision criteria. Thus, it is possible to provide a demodulating apparatus applicable to a wide range of frequency.

According to an eighth aspect of the present invention, in the first aspect, the modulation period is any one of once, twice, and three times an inverse of the minimum inverse frequency.

BRIEF DESCRIPTION OF THE DRAWINGS

FIG. 1 is a block diagram showing the structure of a digital audio interface signal demodulating apparatus according to a first embodiment of the present invention;

FIG. 2 is a block diagram showing the structure of an edge detector of FIG. 1;

FIG. 5 is a table used for 1T, 2T, and 3T decision by an nT decision unit of FIG. 1;

FIG. 6 is a block diagram showing the structure of a digital audio interface signal demodulating apparatus according to a second embodiment of the present invention;

FIG. 7 is a block diagram showing the structure of a digital audio interface signal demodulating apparatus according to a third embodiment of the present invention;

FIG. 12 is a timing chart showing various signals observed in a digital audio interface signal demodulating apparatus shown in FIG. 11.

BEST MODE FOR CARRYING OUT THE INVENTION

Figure 3:
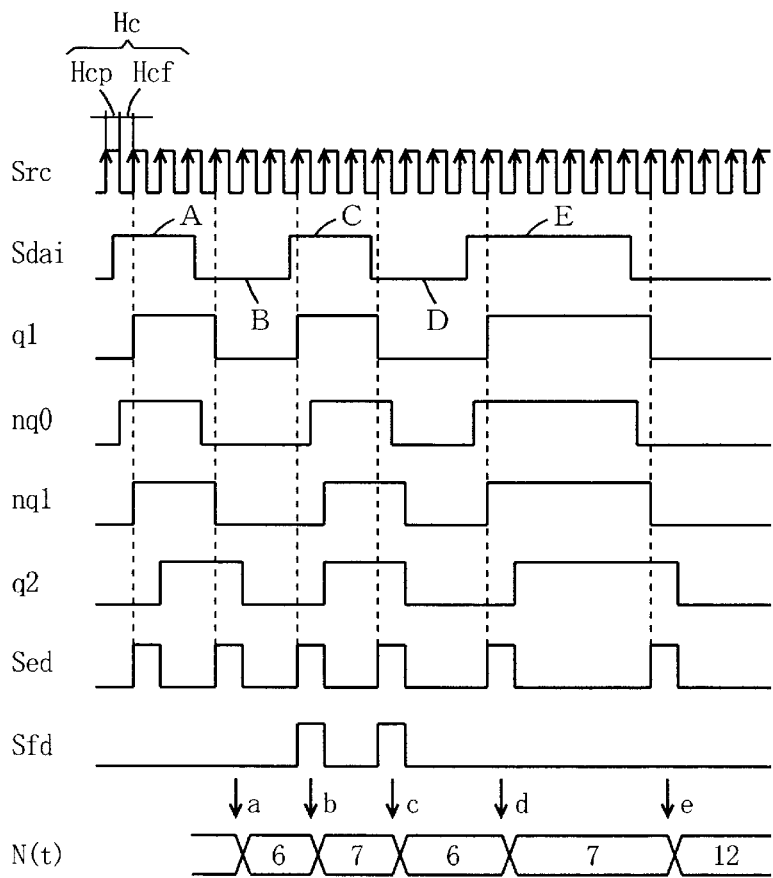
FIG. 3 is a timing chart showing various signals observed in the edge detector and a count value calculator of FIG. 1.

Described first is a basic concept of a digital audio interface signal demodulating apparatus according to the present invention. As described above, the present invention is to solve the above problems caused by the analog PLL circuit by constructing a digital audio interface signal demodulating apparatus in full digital. For full digitalization, however, new problems may possibly arise as described below.

First, to ensure control accuracy, the frequency of a reference clock should be set higher than that in a case where an analog PLL is used. As a result, such high frequency causes an increase in power consumption, and requires a high-speed process for supporting high frequency, thereby increasing process cost.

Furthermore, only receivable is a signal having a frequency within a predetermined range with respect to the frequency of the reference clock. Therefore, to demodulate a plurality of digital audio interface signals of varying frequencies, required is using, in a switching manner, a plurality of reference clocks having varying frequencies corresponding to the frequencies of the signals to be demodulated. Consequently, the apparatus becomes complex and the cost is increased.

An object of the present invention is to provide a digital audio interface signal demodulating apparatus that prevents problems that may arise due to full digitization and solves problems unique to a conventional digital audio interface signal demodulating apparatus having an analog PLL. (First Embodiment) With reference to FIGS. 1, 2, 3 and 4, described below is a digital audio interface signal demodulating apparatus DDAp1 according to a first embodiment of the present invention.

As shown in FIG. 1, the digital audio interface signal demodulating apparatus DDAp1 includes an edge detector 1, a count value calculator 2, an approximately 3T detector 3, an approximately 3T period detector 4, an nT decision unit 5, a preamble detector 6, and a bi-phase demodulator 7.

The edge detector 1 outputs a pulse-like edge detection signal Sed whenever detecting the edge of an inputted digital audio interface signal Sdai based on a positive edge of a reference clock Src, and also outputs a latter-half detection signal Sfd indicating that the edge of a digital audio interface signal Sda has been found in the latter half of the reference clock Src.

The count value calculator 2 counts, whenever the edge detection signal Sed is inputted, the number of intervals between the edge detection signals Sed based on the reference clock Src, and obtains an edge interval count value Cei. Furthermore, the count value calculator 2 outputs a half clock count value Shc having a value obtained by multiplying the edge interval count value Cei by 2, and adding 1 to the multiplication result if the latter-half detection signal Sfd is inputted and subtracting 1 therefrom if the immediately preceding latter-half detection signal Sfd is inputted.

The approximately 3T detector 3 counts, whenever the edge detection signal Sed is inputted, the number of intervals between the edge detection signals Sed based on the reference clock Src, and obtains the edge interval count value Cei (not shown) and, if the count value is within predetermined range values, detects the interval as approximately 3T and outputs an approximately 3T detection signal S3T. Note that this predetermined values are so determined as to be optimal through experiment based on the above mentioned standards, manufacturing precision, and also noise in a transmission path.

The approximately 3T period detection 4 counts the period of the approximately 3T detection signal S3T supplied by the approximately 3T detector 3 to obtain an approximately3T interval count value C3ta, and outputs it as approximately 3T period information I3T.

Based on the half clock count value Shc supplied by the count value calculator 2 and the approximately 3T period information I3T supplied by the approximately 3T period detector 4, the nT decision unit 5 decides the presence or absence of a pulse boundary of T multiplied by n (n is an arbitrary integer), and generates a decision signal Sj indicating a decided pulse width nT. Note that, in the present embodiment, a boundary between 1T and 2T and a boundary between 2T and 3T are decided in compliance with the above stated standards for digital audio interface signals.

The preamble detector 6 detects, based on the decision signal Sj supplied by the nT decision unit 5, one of a sequence composed of 3T, 1T, 1T and 3T, a sequence composed of 3T, 3T, 1T, and 1T, and a sequence composed of 3T, 2T, 1T and 2T, and outputs the detected one as a preamble signal Spa.

The bi-phase demodulator 7 outputs, based on the decision signal Sj supplied by the nT decision unit 5, "0" if the digital audio interface signal Sdai is 2T after the time when the preamble signal Spa supplied by the preamble detector 6 becomes "L", the bi-phase demodulator 7, and outputs "1" if the sequence composed of successive 1T and 1T, for obtaining demodulation data. Furthermore, the bi-phase demodulator 7 separates audio data from the obtained demodulation data to output the digital audio signal Sda.

Note that the reference clock Src has a frequency whose period is shorter than half of the minimum inverse period (1T) of the digital audio interface signal Sdai, that is, an arbitrary frequency higher than twice the minimum inverse frequency of the digital audio interface signal Sdai, and also does not necessarily synchronize with the digital audio interface signal Sdai. For example, a clock of 16.9344 MHz can be used.

With reference to FIG. 2, described next in detail is the operation of the edge detector 1. The edge detector 1 includes a flip-flop 1_01, a flip-flop 1_02, a flip-flop 1_03, a flip-flop 1_04, an XOR element 1_05, and an XOR element 1_06.

The flip-flop 1_01 extracts a signal from the digital audio interface signal Sdai based on the positive edge of the reference clock Src, and outputs the resultant signal as a first-order positive edge signal q1.

The flip-flop 1_03 extracts a signal from the first-order positive edge signal q1 supplied by the flip-flop 1_01 based on the positive edge of the reference clock Src, and outputs the resultant signal as a second-order positive edge signal q2.

The flip-flop 1_02 extracts a signal from the digital audio interface signal Sdai based on the negative edge of the reference clock Src, and outputs the resultant signal as a 0-order negative edge signal nq0.

The flip-flop 1_04 further extracts a signal from the 0-order negative edge signal nq0 supplied by the flip-flop 1_02 based on the positive edge of the reference clock Src, and outputs the resultant signal as a 0-order positive edge signal nq1.

The XOR element 1_05 XORs the first-order positive edge signal q1 supplied by the flip-flop 1_01 and the second-order positive edge signal q2 supplied by the flip-flop 1_03, and outputs the resultant signal as the edge detection signal Sed.

The XOR element 1_06 XORs the first positive edge signal q1 supplied by the flip-flop 1_01 and the 0-order positive edge signal nq1 supplied by the flip-flop 1_04, and outputs the resultant signal as the latter-half detection signal Sfd.

With reference to a timing chart shown in FIG. 3, described next is the operation of the edge detector 1 in detail. First, the reference clock Src, which is a pulse signal having a predetermined period as shown in the drawing, is supplied to the edge detector 1 and the count value calculator 2.

In the drawing, the digital audio interface signal Sdai having high-level portions and low-level portions as shown in A, B, C, D, and E is supplied to the edge detector 1. These portions are hereinafter respectively referred to as a high-level A portion, a low-level B portion, a high-level C portion, a low-level D portion, and a high-level E portion.

The high-level A portion has a pulse width of approximately 6Hc (6Hcp or 6Hcf) as counted by a half clock of the reference clock. As counted similarly, the low-level B portion has a pulse width of approximately 7Hc, the high-level C portion has a pulse width of approximately 6Hc, the low-level D portion has a pulse width o approximately 7Hc, and the high-level E portion has a pulse with of approximately 12Hc. Note that the pulse width is not necessarily an integral multiple of the width of the half clock of the reference clock. successive In the edge detector 1, the first-order positive edge signal q1 extracted from the digital audio interface signal Sdai based on the positive edge of the reference clock Src rises in accordance with the positive edge of the reference clock Src, and stays at the high level during a successive-three-clock period of the reference clock Src while the digital audio interface signal Sdai is at the high level. At the clock's leading edge appearing next to successive three clocks of the reference clock Scr, the digital audio interface signal Sdai is at the low level, and therefore the first-order positive edge signal q1 becomes at the low level. Similarly, the 0-order negative edge signal nq0 extracted from the digital audio interface signal Sdai based on the negative edge of the reference clock Src, the 0-order positive edge signal nq1 re-extracted from the 0-order negative edge signal nq0 with the positive edge of the reference clock Src, and the second-order positive edge signal q2 further extracted from the first-order edge signal q1 based on the positive edge of the reference clock Src respectively have the waveforms as shown in FIG. 3.

The latter-half detection signal Sfd obtained by XORing the first-order positive edge signal q1 and the 0-order positive edge signal nq1 is outputted, when the digital audio interface signal Sdai is changed in the latter-half portion of the reference clock Src (within a time corresponding to Hcf of the reference clock Src), such as an edge between the low-level B portion and the high-level C portion, an edge between the high-level C portion and the low-level D portion.

In the count value calculator 2, from an edge interval count value Cei of the edge detection signal Sed, a value p(t) of the latter-half detection signal Sfd, and the immediately preceding detection signal p(t−1) of the edge of the counted edge detection signal Sed, a half clock count value N(t) is given by the following equation (1), where t is a time when changes in the edge detection signal Sed and the digital audio interface signal Sdai are detected.

$$N(t) = -p(t-1) + 2 \times Cei + p(t) \tag{1}$$

Note that p(t) is a signal indicating that a change occurs in the digital audio interface signal Sdai in the latter-half portion between the edges of the count clock.

The concept in this equation (1) is now briefly described. If the edge appears at the latter-half portion between the edges of the immediately preceding clock at the time of calculation, that means the actual signal is longer than the edge interval count value Cei. If the edge appears in the latter-half portion between the edges one sampling before the calculation, that means the real signal is shorter than the edge interval count value Cei.

First, the edge interval count value is doubled and, by using p(t) at the time of calculating the edge interval count value Cei and p(t−1) immediately before the edge detected by the edge detection signal Sed, N(t) is calculated based on the above equation (1). Note that p(t−1) and P(t) are 1 or 0. Therefore, for the high-level A portion of the reference clock Src, the edge interval count value Cei is 3. Also, since the latter-half detection signal Sfd does not rise, the value of N(t) is 6.

For the low-level B portion of the reference clock Src, the edge interval count value Cei is 3. Also, since the latter-half detection signal Sfd rises, the value of N(t) is 7.

For the high-level C portion of the reference clock Src, the edge interval count value Cei is 3. Since the latter-half detection signal Sfd has continuously risen, the value of N(t) is 6.

Then, for the high-level E portion, the value of N(t) is 12.

These values of N(t) are outputted from the count value calculator 2 as the half clock count values Shc.

Figure 4:
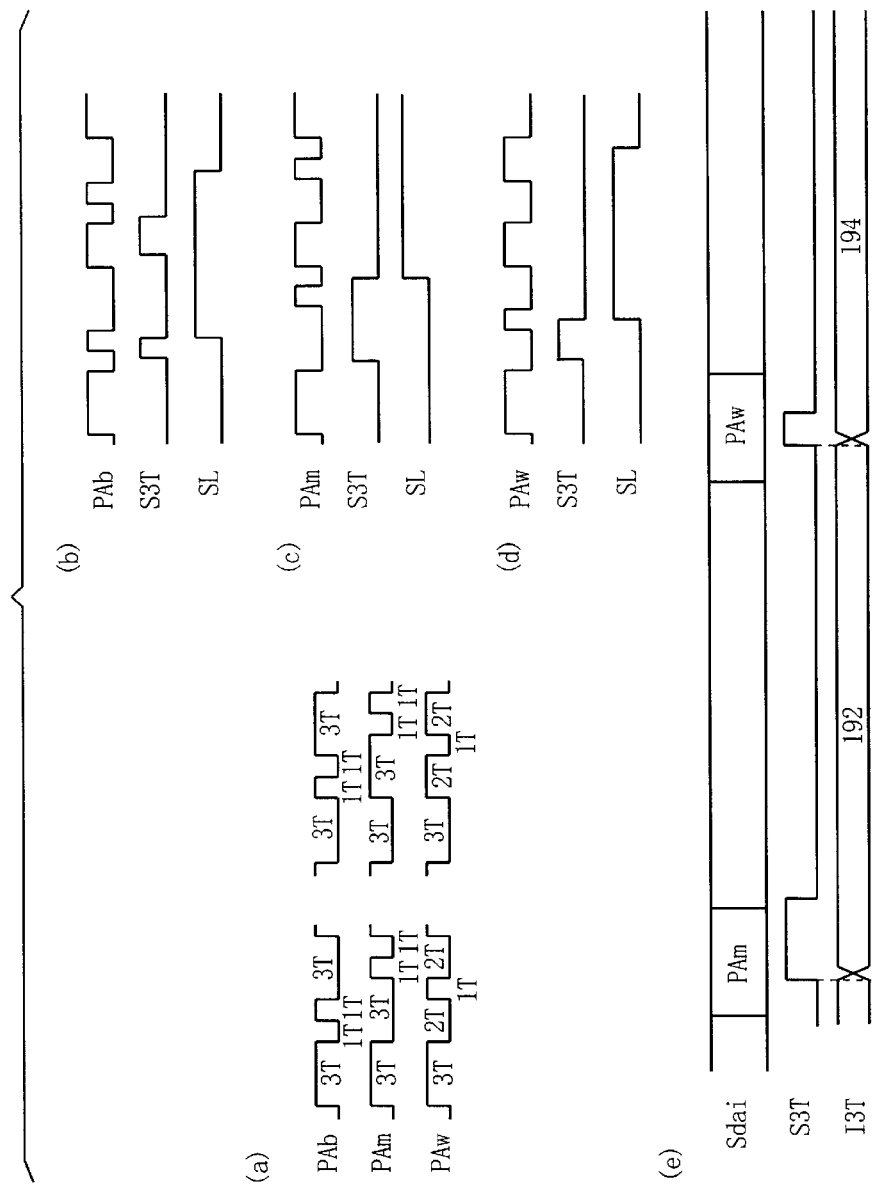
FIG. 4 is a timing chart showing various signals observed in an approximately 3T detector and an approximately 3T period detector of FIG. 1.

With reference to FIG. 4, described next is the operation of the approximately 3T detector 3 and the approximately 3T period detector 4.

First, as shown in FIG. 4(a), the preamble signal is any one of three types: a preamble PAb having a periodic pattern of 3T, 1T, 1T, and 3T, a preamble PAm having a periodic pattern of 3T, 3T, 1T, and 1T, and a preamble PAw having a periodic pattern of 3T, 2T, 1T, and 2T.

Supplied with any of inputs of the preambles PA having the above periodic patterns, the approximately 3T detector 3 outputs the approximately 3T detection signal S3T, when the edge interval count value Cei having the width of the period of approximately 3T, as shown in FIGS. 4(b), 4(c), and 4(d).

The approximately 3T detector 3 predetermines an approximately 3T interval count value C3ta having a width of the period of approximately 3T with respect to the edge interval counter value Cei of the edge detection signal Sed, and if the count value C3Ta falls within the range, outputs the approximately 3T detection signal S3T.

The approximately 3T period detector 4 outputs the approximately 3T period information I3T obtained by counting the interval between leading edges of the approximately 3T detection signal S3T.

With reference to FIG. 5 showing a decision table, described next is the operation of the nT decision unit 5. Note that FIG. 5(a) is an nT decision table T3k when the sampling frequency is 32 kHz, and FIG. 5(b) is an nT decision table T4k when the sampling frequency is 44.1 kHz/48 kHz.

Based on the count value C3Ta of the approximately 3T period information I3T, the nT decision unit 5 refers to either the nT decision table T3k or the nT decision table T4k to decide the periodic pattern as 1T, 2T, or 3T, and outputs the decision signal Sj.

Note that, for deciding to use which of the nT decision table T3k for the sampling frequency 32 kHz of the digital audio interface signal Sdai or the nT decision table T4k for a set of 44.1 kHz and 48 kHz, switching means (not shown) is used for switchably using the nT decision table T3k and the nT decision table T4k.

Based on the decision signal Sj, the preamble detection circuit 6 detects one of three types of pattern: the preamble PAb's periodic pattern of 3T, 1T, 1T, and 3T, the preamble PAm's periodic pattern of 3T, 3T, 1T, and 1T, and the preamble PAw's periodic pattern of 3T, 2T, 1T, and 2T; and outputs the preamble detection signal Spa.

The preamble detection circuit 6 stores four decision signals Sj. That is, since each preamble PA is composed of four types of period unit, four decision signals Sj have to be stored, respectively detecting the amplitude of one of four types of period unit. If any one of the above three patterns is detected, "H" is outputted. 28 bits of the digital audio interface signal Sdai from the trailing edge of "H" of the preamble detection signal SPa is a bi-phase-mark-modulated portion.

The bi-phase demodulator 7 outputs, from the trailing edge of the preamble detection signal Spa, "0" if 2T, and outputs "1" if successive 1T and 1T, thereby obtaining demodulation data. From the demodulation data, audio data is separated, and outputted as the digital audio signal Sda.

As described above, in the present embodiment, edge detection is carried out on the digital audio interface signal Sdai at both positive and negative edges of the reference clock signal Src. From a detection output, the count value at the half clock of the reference clock Src is obtained. The count value is decided as either one of 1T, 2T, or 3T by the period of the approximately 3T. Thus, the digital audio interface signal Sdai can be demodulated at the reference clock Src having a relatively low frequency and not necessarily synchronizing with the inputted digital audio interface signal Sdai without using any analog PLL circuit. Also, the period of the approximately 3T is measured, and decided from the tables as either one of 1T, 2T, or 3T that is suitable for the period. Thus, it is possible to realize a digital audio interface signal demodulating apparatus adaptable even to a wide range of frequency.

(Second Embodiment)

With reference to FIG. 6, described is a digital audio interface signal demodulating apparatus according to a second embodiment of the present invention. A digital audio interface signal demodulating apparatus DDAp2 according to the present embodiment has the structure similar to that in the digital audio interface signal demodulating apparatus DDAp1 shown in FIG. 1, and includes a digital filter 8 newly provided between the approximately 3T period detector 4 and the nT decision unit 5.

The digital filter 8 is provided for obtaining stable approximately 3T period information I3Ts even if the approximately 3T period information I3T outputted from the approximately period detector 4 is fluctuated by erroneous detection due to noise or other factors.

In other words, the digital filter 8 carries out digital filtering on the approximately 3T period information I3T supplied by the approximately 3T period detector 4, and outputs the stable approximately 3T period information I3Ts. Also, a digital filter coefficient is appropriately selected. Thus, for slow fluctuations of the approximately 3T period information I3T, the stable approximately 3T period information I3Ts capable of following the fluctuation is outputted, thereby correctly deciding the period as either one of 1T, 2T, or 3T.

Supplied with the half clock count value Shc, the nT decision unit 5 decides, based on the value of the stable approximately 3T period information I3Ts, the boundary between 1T and 2T and the boundary between 2T and 3T for deciding 1T, 2T, and 3T, and outputs the decision result as the decision signal Sj.

As such, in the present embodiment, with the digital filter 8, the stable approximately 3T period information I3Ts can be obtained even if the approximately 3T period information I3T outputted by the approximately 3T period detector 4 is fluctuated by erroneous detection due to noise or other factors. Furthermore, the approximately 3T period information I3Ts can follow slow fluctuations of the approximately 3T period information I3T. Therefore, the nT decision unit 5 can correctly decide the period as either one of 1T, 2T, and 3T.

(Third Embodiment)

With reference to FIG. 7, described is a digital audio interface signal demodulating apparatus according o a third embodiment of the present invention. A digital audio interface signal demodulating apparatus DDAp3 according to the present embodiment has the structure similar to that in the digital audio interface signal demodulating apparatus DDAp1 shown in FIG. 1, and includes a limiter 9 newly provided between the approximately 3T detector 3 and the approximately 3T period detector 4.

With reference to the above described FIG. 4, described below is the operation of the limiter 9. For the preamble PAb, the periodic pattern becomes as 3T, 1T, 1T, and 3T, and 3Ts are close to each other as shown in FIG. 4(b). Therefore, the approximately 3T detection signal S3T is detected twice by the approximately 3T detector 3. To correctly obtain the approximately 3T detection signal S3TL also in this case, as shown in FIGS. 4(b), 4(c), and 4(d), the limiter 9 detects the first approximately 3T in the approximately 3T detection signal S3T supplied by the approximately 3T detector 3, and adds a limit signal so as not to output the approximately 3T detection signal for a predetermined time period from the trailing edge of the approximately 3T detection signal S3T, thereby limiting the approximately 3T detection signal S3T and outputting a more correct approximately 3T detection signal S3TL.

Then, the approximately 3T period detector 4 counts the period of the correct approximately 3T detection signal S3TL supplied by the limiter 9 for obtaining a count value, and outputs it as the approximately 3T period information I3T. Supplied with the half clock count value Shc, the nT decision unit 5 decides, with the value of the stable approximately 3T period information I3T, the boundary between 1T and 2T and the boundary between 2T and 3T for deciding 1T, 2T, and 3T, and outputs the decision result as the decision signal Sj.

As such, in the present embodiment, the limiter 9 is inserted between the approximately 3T detector 3 and the approximately 3T period detector 4. Even if 3Ts of the preamble PA are close to each other, the first approximately 3T is detected, and the limit signal is added so that the approximately 3T detection signal is not outputted for the predetermined period from the trailing edge of the approximately 3T detection signal S3T for limiting the approximately 3T detection signal S3T. With more correct approximately 3T detection signal S3TL obtained, further more correct approximately 3T period information I3T can be outputted.

(Fourth Embodiment)

Figure 8:
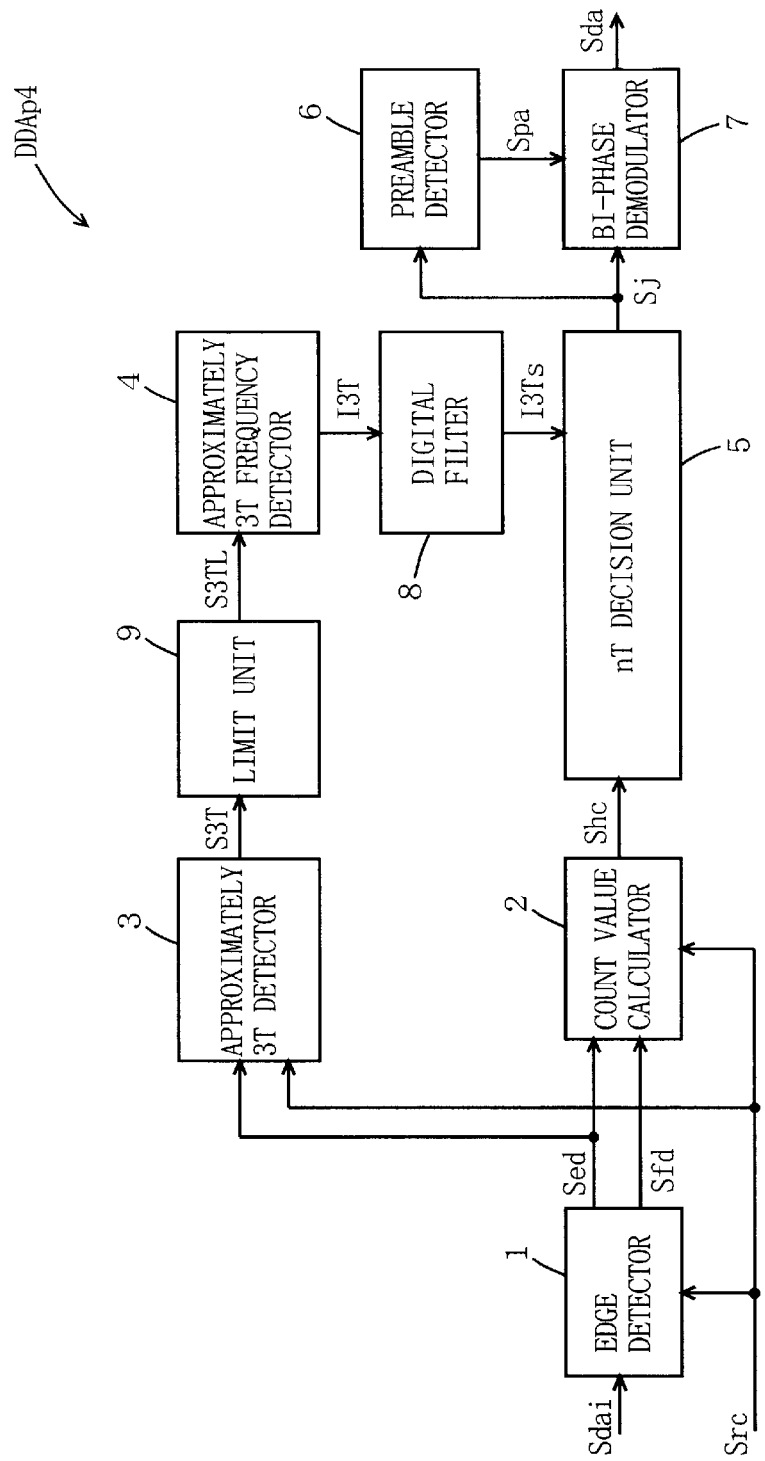
FIG. 8 is a block diagram showing the structure of a digital audio interface signal demodulating apparatus according to a fourth embodiment of the present invention.

With reference to FIG. 8, described next is a digital audio interface signal demodulating apparatus according to a fourth embodiment of the present invention. A digital audio interface signal demodulating apparatus DDAp4 according to The present embodiment has the structure of a combination of the digital audio interface signal demodulating apparatus DDAp2 shown in FIG. 6 and the digital audio interface signal demodulating apparatus DDAp3 shown in FIG. 7.

In other words, the digital audio interface signal demodulating apparatus DDAp4 has a structure similar to that of the digital audio interface signal demodulating apparatus DDAp1, and includes the limiter 9 newly provided between the approximately 3T detector 3 and the approximately 3T period detector 4, and also the digital filter 8 newly provided between the approximately 3T period detector 4 and the nT decision unit 5.

With reference to FIG. 4, described below is the operation of the digital audio interface signal demodulating apparatus DDAp4.

The limiter 9 limits the approximately 3T detection signal S3T supplied by the approximately 3T detector 3 and, as shown in FIGS. 4(b), (c), and (d), adds the limit signal for the predetermined time period from the trailing edge of the approximately 3T detection signal S3T whose first approximate 3T has been detected for liming the approximately 3T detection signal S3T, and outputs the more correct approximately 3T detection signal S3TL.

Supplied with the correct approximately 3T detection signal S3TL by the limiter 9, the approximately 3T period detector 4 counts the period thereof for obtaining a count value, and outputs it as the approximately 3T period information I3T.

The digital filter 8 carries out digital filtering for outputting the stable approximately 3T period information I3Ts even if the approximately 3T period information I3T is fluctuated by erroneous detection of the approximately 3T detection signal S3T due to noise or other factors. The approximately 3T period information I3Ts can follow slow fluctuations of the approximately 3T period information I3T, and therefore the nT decision unit 5 can correctly decides the width of the period (1T, 2T, and 3T).

(Fifth Embodiment)

Figure 9:
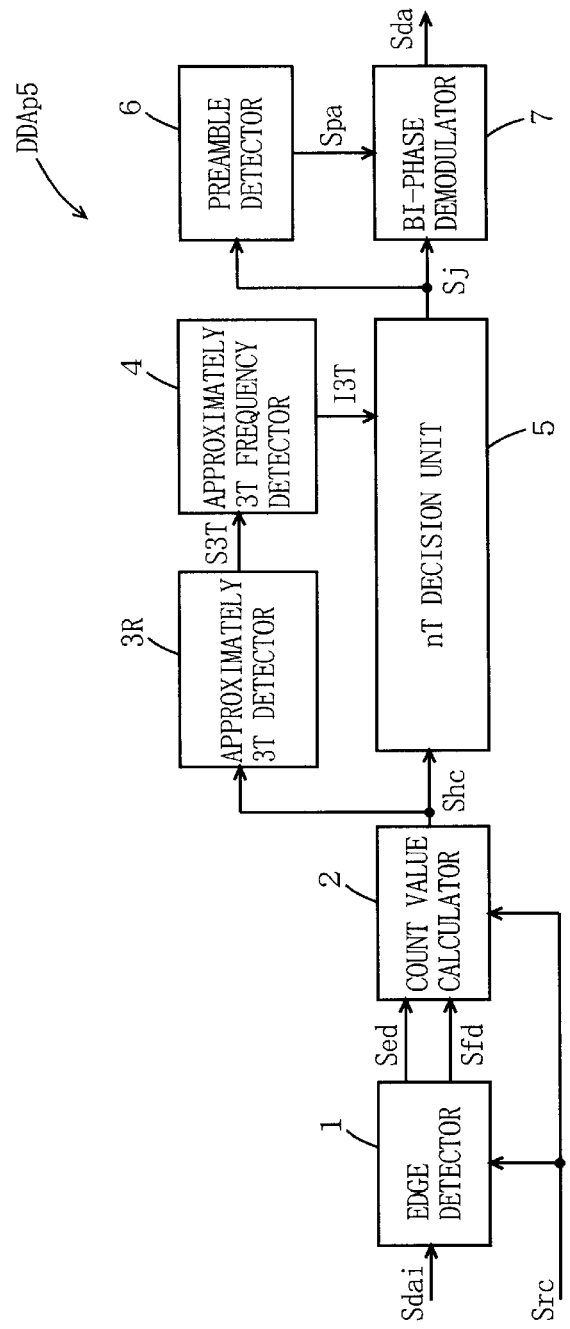
FIG. 9 is a block diagram showing the structure of a digital audio interface signal demodulating apparatus according to a fifth embodiment of the present invention.
Figure 10:
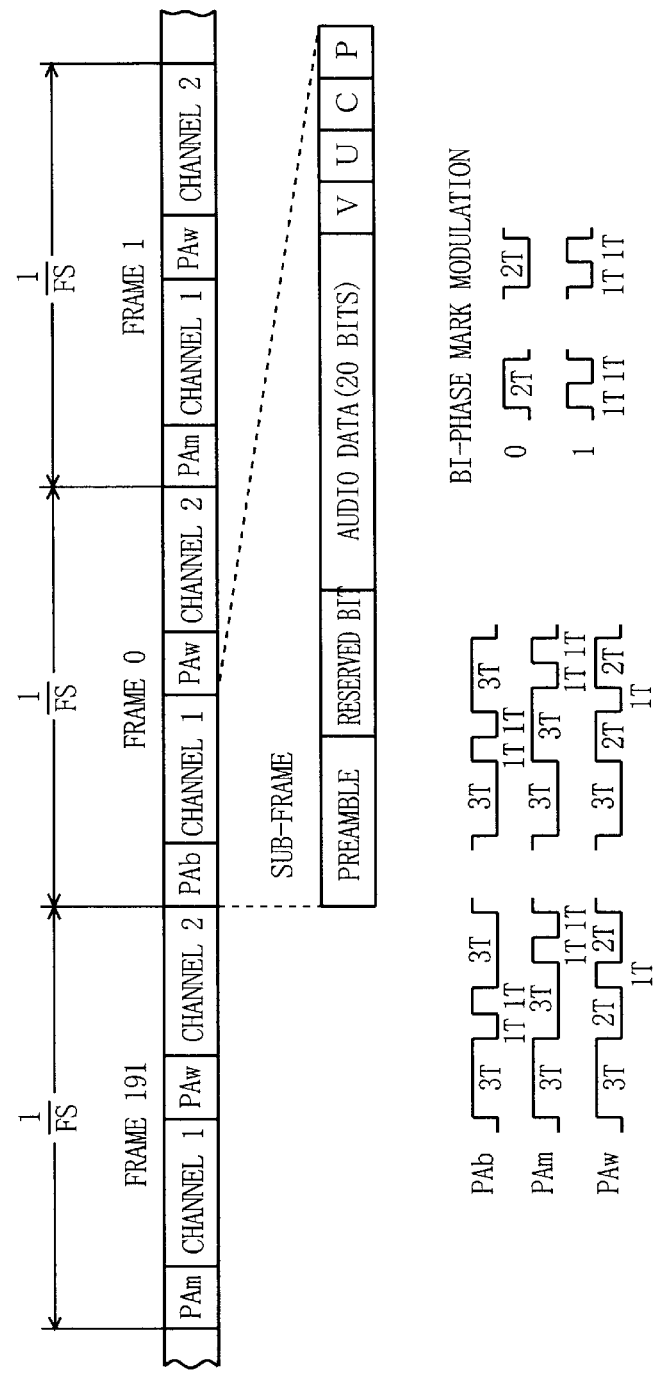
FIG. 10 is a diagram indicating outlines of digital audio interface standards.
Figure 11:
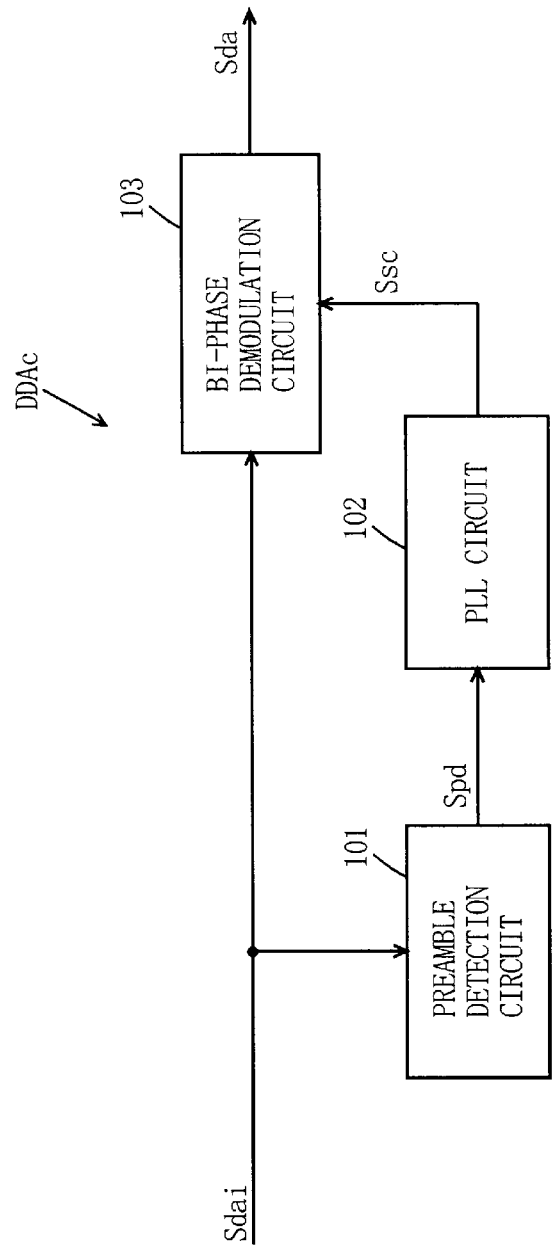
FIG. 11 is a block diagram showing the structure of a conventional digital audio interface signal demodulating apparatus.

With reference to FIG. 9, described is a digital audio interface signal demodulating apparatus according to a fifth embodiment of the present invention. A digital audio interface signal demodulating apparatus DDAp5 according to the present embodiment is similar in structure to the digital audio interface signal demodulating apparatus DDAp1 shown in FIG. 1, except that the approximately 3T detector 3 is replaced by an approximately 3T detector 3R, and instead of the reference clock Src and the edge detection signal Sed supplied to the approximately 3T detector 3, the approximately 3T detector 3, is supplied with a half clock count value Shc.

The approximately 3T detector 3R previously determines, with respect to the value of the half clock count value Shc, a count value having the width of approximately 3T. As a result, if the count value N(t) falls within the predetermined range, an approximately 3T detection signal S3Ta is outputted, which is more correct than the approximately 3T detection signal S3T for the digital audio interface signal demodulating apparatus DDAp1.

Then, the approximately 3T period detector 4 counts the period of the approximately 3T detection signal S3Ta supplied by the approximately 3T detector 3R to obtain a value C3Ta, and outputs it as approximately 3T period information I3T.

The nT decision unit 5 determines, based on the half clock count value Shc supplied by the count value calculator 2 and the value of the stable approximately 3T period information I3T supplied by the approximately 3T period detector 4, the boundary between 1T and 2T and the boundary between 2T and 3T for deciding 1T, 2T, and 3T, and outputs the decision result as the decision signal Sj.

As such, with the value of the half clock count value Shc, approximately 3T detection is carried out on the edge interval count value Cei of the edge interval of the edge detection signal Sed, thereby obtaining the more correct approximately 3T value detection signal S3T to enable output of the correct approximately 3T period information I3T.

A specific example of each circuit of the above embodiments can be arbitrarily modified as long as it satisfies the scope of claim for patent.

Also, numerical values exemplarily shown and a combination thereof are only example, and should be changed according to changes in condition.

Furthermore, each of the above embodiments is shown with LSI in mind, but all or part of the function of each circuit can be also implemented on software.

As described above, the digital audio interface signal demodulating apparatus of the present invention carries out edge detection on the digital audio interface signal by using both of the positive and negative edges of the reference clock and, with this output, obtains the count value at the half clock of the reference clock. Also, from the edge detection in the digital audio interface signal, the approximately 3T information is detected, and its period is obtained. From the value of the period, a demodulation output is obtained by table decision. Thus, it is possible to demodulate only with the reference clock having a low frequency without using any PLL, and provide a demodulating apparatus capable of supporting a digital audio interface signal of a wide range of frequency.

Also, with analog circuits such as a PLL and LPF not required, the circuit size can be reduced, and a wide-range-frequency digital audio interface signal demodulating apparatus with stable operation can be realized.

INDUSTRIAL APPLICABILITY

The present invention can be applied to digital audio equipments that demodulate digital audio interface signals, such as compact discs, digital audio tape players, and mini discs.

What is claimed is:

1. A digital audio interface signal demodulating apparatus for adding a preamble and additional information to a digital audio signal and demodulating a digital audio interface signal bi-phase-modulated for transmission, said apparatus comprising:

edge detection means for generating, whenever detecting an edge of said digital audio interface signal, a pulse-like edge detection signal and a latter-half detection signal, indicating that the edge of said digital audio interface signal is present, based on a positive edge of a reference clock having a frequency higher than twice a minimum inverse frequency of said digital audio interface signal and not necessarily synchronizing with said digital audio interface signal;

count value calculation means for obtaining whenever supplied with said edge detection signal, a count value by counting the edge detection signal in accordance with said reference clock, and calculating a half clock count value by adding, to a value obtained by multiplying the count value by 2, 1 if the latter-half detection signal is supplied, and subtracting 1 from the count value if an immediately preceding latter-half detection signal is supplied;

approximately 3T detection means for obtaining, whenever supplied with said edge detection signal, a count value by counting the edge detection signal in accordance with said reference clock, and generating a first approximately 3T detection signal by detecting a value of said count value within a predetermined range;

approximately 3T period detection means for counting the period of said first approximately 3T detection signal in accordance with said reference clock, and generates first approximately 3T period information;

decision means for deciding a modulations period of modulating said digital audio interface signal by comparing said half clock count value with a predetermined table corresponding to said first approximately 3T detection signal, and generating a decision signal;

preamble detection means for detecting said preamble based on said decision signal, and generates a preamble detection signal; and bi-phase demodulation means for carrying out demodulation, for output, into the digital audio signal from said decision signal with timing of said preamble detection signal.

2. The digital audio interface signal demodulating apparatus according to claim 1, wherein said edge detection means generates a first extracted signal extracted from said digital audio interface signal based on said reference clock, generates a first inverse extracted signal extracted from said digital audio interface signal based on an inverse clock of said reference clock and further based on said reference clock, and outputs said edge detection signal by detecting an edge of said first extracted signal, and generates said latter-half detection signal by XORing said first extracted signal and said first inverse extracted signal.

3. The digital audio interface signal demodulating apparatus according to claim 1, said apparatus further comprising:

digital filter means for filtering said first approximately 3T period information, and generating second approximately 3T period information, wherein said decision means generates said decision signal by comparing said half clock count value with a predetermined table corresponding to said second approximately 3T period information.

4. The digital audio interface signal demodulating apparatus according to claim 1, said apparatus further comprising:
limit means for suppressing said first approximately 3T detection signal for a predetermined time period, and then outputting as a second approximately 3T detection signal, wherein
said approximately 3T period detection means counts the period of said second approximately 3T detection signal in accordance with said reference clock.

5. The digital audio interface signal demodulating apparatus according to claim 1, said apparatus further comprising:
limit means for suppressing said first approximately 3T detection signal for a predetermined time period, and then outputting as a second approximately 3T detection signal; and
digital filter means for filtering said first approximately 3T period information and generating second approximately 3T period information, wherein
said approximately 3T period detection means counts a period of said second approximately 3T detection signal in accordance with said reference clock, and
said decision means generates the decision signal indicating the period of modulating said digital audio interface signal by comparing said half clock count value with a predetermined table corresponding to said second approximately 3T period information.

6. A digital audio interface signal demodulating apparatus for adding a preamble and additional information to a digital audio signal and demodulating a digital audio interface signal bi-phase-modulated for transmission, said apparatus comprising:
edge detection means for generating, whenever detecting an edge of said digital audio interface signal, a pulse-like edge detection signal and a latter-half detection signal indicating that the edge of said digital audio interface signal is present, based on a positive edge of a reference clock having a frequency higher than twice a minimum inverse frequency of said digital audio interface signal and not necessarily synchronizing with said digital audio interface signal;
count value calculation means for obtaining, whenever supplied with said edge detection signal, a count value by counting the edge detection signal in accordance with said reference clock, and calculating a half clock count value by adding, to a value obtained by multiplying the count value by 2, 1 if the latter-half detection signal is supplied, and subtracting 1 from the count value if an immediately preceding latter-half detection signal is supplied;
approximately 3T detection means for generating a third approximately 3T detection signal by detecting a value of said half clock count value within a predetermined range;
approximately 3T period detection means for counting a period of said third approximately 3T detection signal in accordance with said reference clock, and generates first approximately 3T period information;
decision means for deciding a modulation period of modulating said digital audio interface signal by comparing said half clock count value with a predetermined table corresponding to said first approximately 3T detection signal, and generating a decision signal;
preamble detection means for detecting said preamble based on said decision signal, and generates a preamble detection signal; and
bi-phase demodulation means for carrying out demodulation, for output, into the digital audio signal from said decision signal with timing of said preamble detection signal.

7. The digital audio interface signal demodulating apparatus according to claim 1, said apparatus further comprising:
switching means for switching among a plurality of predetermined tables corresponding to said first approximately 3T period information.

8. The digital audio interface signal demodulating apparatus according to claim 1, wherein
the modulation period is any one of once, twice, and three times an inverse of said minimum inverse frequency.

* * * * *